United States Patent [19]

Coquerel

[11] Patent Number: 4,904,957
[45] Date of Patent: Feb. 27, 1990

[54] SERVO DEVICE FOR RAPIDLY, AND WITH LOW NOISE, LOCKING THE FREQUENCY AND PHASE OF SIGNAL TO THAT OF AN IMPOSED SIGNAL

[75] Inventor: Patrick Coquerel, Houilles, France

[73] Assignee: Institut Francais du Petrole, Rueil Malmaison, France

[21] Appl. No.: 278,842

[22] Filed: Dec. 2, 1988

[30] Foreign Application Priority Data

Dec. 3, 1987 [FR] France .................. 87 16947

[51] Int. Cl.⁴ .............................................. H03L 7/10
[52] U.S. Cl. ........................................ 331/11; 331/23
[58] Field of Search ................ 331/10, 11, 17, 23, 331/25, DIG. 2

[56] References Cited

U.S. PATENT DOCUMENTS

| 4,409,563 | 10/1983 | Vandegraaf | 331/25 X |
| 4,433,308 | 2/1984 | Hirata | 332/19 |
| 4,748,425 | 5/1988 | Heck | 331/17 |

FOREIGN PATENT DOCUMENTS 0092657 11/1983 European Pat. Off. .
2535545 5/1984 France .

OTHER PUBLICATIONS

Patent Abstracts of Japan, vol. 10, No. 113 (E-399)[2170], 26 Apr. 1986, p. 137 E 399; JP-A-60 249 429 (FUJITSU K.K.), 10/12/85.
IBM Technical Disclosure Bulletin, vol. 21, No. 6, Nov. 1978, pp. 2482-2483, New York, U.S.; D. R. Irvin: "FM Angle Modulator With Frequency Compensated Deviation".

Primary Examiner—Eugene R. LaRoche
Assistant Examiner—Robert J. Pascal
Attorney, Agent, or Firm—Antonelli, Terry & Wands

[57] ABSTRACT

A device is provided for locking the frequency and phase of a signal to that of a signal imposed, of the phase locked type. It comprises a modulator mixing a signal whose frequency is proportional to that of a reference signal coming from an oscillator. The low frequency component of the combined signal (isolated by an integrator) is permanently applied to the oscillator to an input with relatively low sensitivity, for the fine corrections, and to a high speed loop comprising a storage element and an amplifier, through a switch controlled by a window comparator. The high speed loop is connected to a higher sensitivity input. The high speed loop only acts during the setting period, for bringing the control voltage of the oscillator back to close to the optimum voltage, the optimization being provided by the permanent loop.

7 Claims, 2 Drawing Sheets

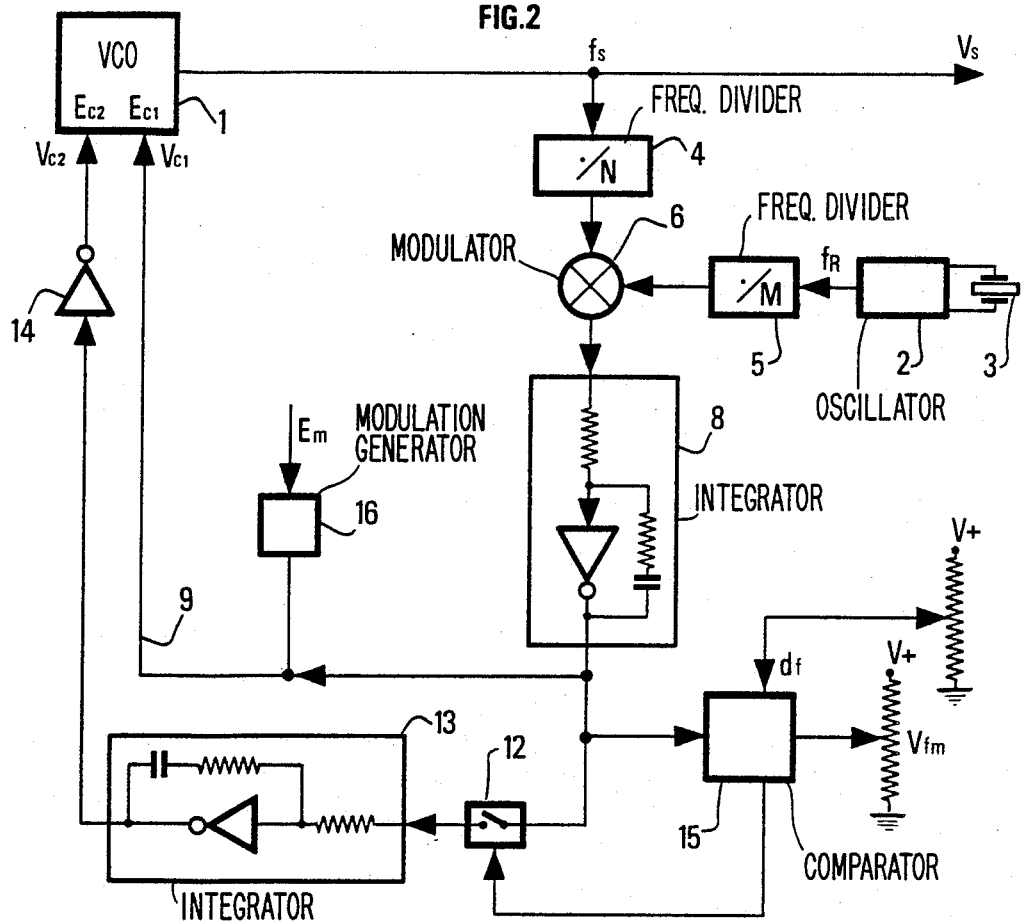
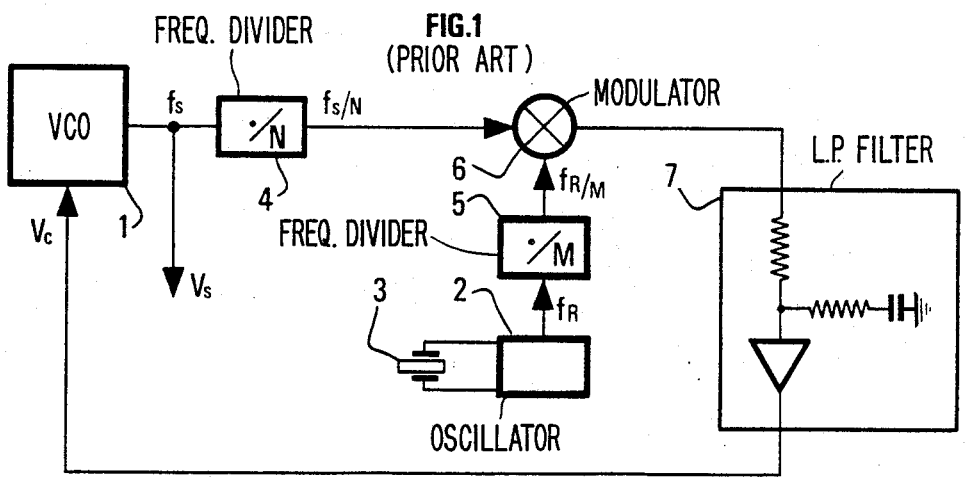

SERVO DEVICE FOR RAPIDLY, AND WITH LOW NOISE, LOCKING THE FREQUENCY AND PHASE OF SIGNAL TO THAT OF AN IMPOSED SIGNAL

BACKGROUND OF THE INVENTION

1. Field of the Invention

The invention relates to a device for rapidly, and with low noise, slaving the frequency and phase of a signal to that of an imposed signal, of a type known as phase locked loop. The device finds applications particularly in the construction of pilot oscillators in FM radio transmitters or else for recovering a clock signal timing the transmission of digitized data. It may for example be used in seismic data transmission systems.

2. Description of the Prior Art

As will be seen further on in greater detail, in connection with FIG. 1, a conventional phase locked loop frequency $f_R$ is used as reference.

The signal from the oscillator is applied for example to an element which divides its frequency by a fixed or adjustable factor M. The resultant signal is mixed by a modulator with another signal whose frequency is a sub multiple (in a given ratio N) of that of a signal from an adjustable frequency oscillator such as a voltage controlled oscillator (VCO). The electric voltage from the modulator, reduced to its low frequency component by a filter of the first or second order, is applied to the control input of the oscillator (VCO). Such a loop has a property of locking the frequency of the signal from the oscillator (VCO) at a frequency $f_s$ proportional to the frequency $f_R$ of the reference oscillator, the ratio of proportionality being equal to N/M. The adjustment or locking time of the loop varies, as is known, proportionally to the time constant of the integrating filter and in inverse ratio to the gain of the loop characterized more particularly by a factor $K_{vco}$. This factor designates the ratio between the frequency variation of the controlled oscillator (VCO) and the control voltage causing this variation and is expressed in kilohertz or megahertz per volt (kHz/V or MHz/V).

Such a locked loop is also characterized by its phase "noise", this term designating the fluctuations of the phase of the signal at the output of the controlled oscillator, after setting of the loop. The phase noise measured is generally proportional to the ratio between the frequency $f_s$ of the signal from the controlled oscillator and that of the reference signal and varies in inverse ratio to the response time of the filter disposed in the feed back (or servo) loop. Since the locking speed of the loop depends directly on this response time, it can be seen that it is difficult to conciliate high locking speed and low phase noise.

In the patent JP 60 249 429 a phase locked loop is described in which the frequency emitted by an oscillator of the VCO type is adjusted by a servo circuit comprising two low pass filters whose time constants are different from each other. A switch controlled by selection means makes it possible to connect successively the fastest then the slowest after re-initialization when frequency tuning is almost achieved.

The device of the invention makes it possible to make the frequency (and the phase) of a signal dependent on that of an imposed signal coming from a reference oscillator, with both a very short response time and a phase noise held at a very low level. It comprises a controlled oscillator whose oscillation frequency can be varied by applying a control voltage and a feed-back (or servo) loop for bringing the control voltage to an optimum value capable of stabilizing the slaved oscillator frequency, the phase noise and the response speed inherent to this loop being relatively low.

SUMMARY OF THE INVENTION

The device of the invention comprises, in parallel with the first servo loop, which is permanently connected, a second servo loop causing a much faster variation of the oscillation frequency of the slaved oscillator than that caused by the first loop and control means for closing the second loop intermittently as long as the difference between the control voltage applied to the slaved oscillator and the optimum value is greater than a given threshold value, the second loop including voltage memorization means.

Since the first servo loop is permanently closed, the frequency drifts and the transient phenomena are avoided which may occur at switching times when two different loops are used successively.

The connecting means of the first loop comprises for example a means for applying a modulation signal whose amplitude is chosen less than the voltage window width of the voltage comparator. The structure of the device with a second high speed loop which only comes into play intermittently, makes it possible to widen the modulation frequency band towards the low frequencies without disturbing the operating stability, as long as the amplitude of the modulation signal remains within the limits fixed for the voltage comparator.

The control means used for closing the second loop intermittently comprise, for example, switching means controlled by a voltage comparator which is adapted for comparing the control voltage with a reference voltage.

The slaved frequency oscillator is preferably chosen so that the ratio between the variation of its oscillation frequency caused by the same variation of the applied control voltage is much greater when this voltage is applied by the second (feed-back or servo) loop than when it is applied by the first loop.

BRIEF DESCRIPTION OF THE DRAWINGS

Other features and advantages of the device of the invention will be clear from the following description of one embodiment given by way of non limitative example with reference to the accompanying drawings in which:

FIG. 1 shows schematically a frequency control device of known type;

FIG. 2 shows a block diagram of the device of the invention;

DESCRIPTION OF THE PREFERRED EMBODIMENT

Figure 3:
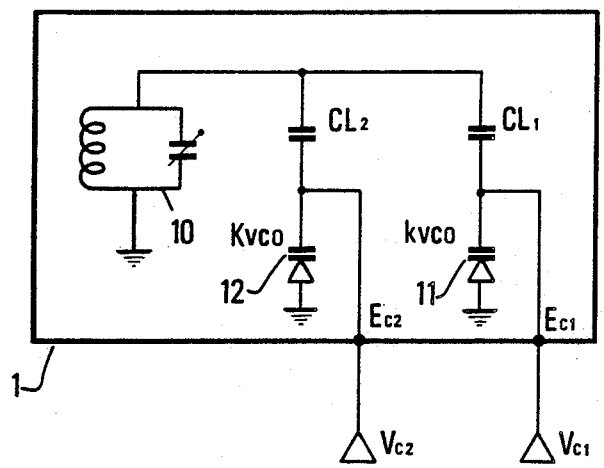
FIG. 3 shows schematically one example of a slaved oscillator associated with capacitive means for modifying its oscillation frequency.

The construction of a phase or frequency locked device with a single servo-loop is known, such as the one shown in FIG. 1. This known device comprises a slaved oscillator 1 whose frequency $f_s$ can be varied by applying a control voltage, of the VCO type for example, and a reference oscillator 2 oscillating at a reference frequency $f_R$ fixed by a quartz 3. The signals from the two oscillators 1 and 2 are applied respectively to two frequency divider elements 4, 5 applying division factors, M for the first and N for the second. The signals at frequencies $f_s/N$ and $f_R/N$ from the two divider elements 4, 5 are applied to a modulator 6. The low frequency component $V_c$ of the resultant signal is isolated by a low pass filter of the first or second order 7 and serves as control voltage for varying the frequency $f_s$ of the signal emitted by the slaved oscillator 1. After locking of the loop, this frequency $f_s$ is equal to $f_R \cdot N/M$.

The adjustment (or locking) speed of the loop varies in inverse ratio to the time constant of the filter and proportionally to a factor $K_{vco}$ defined by the relationship:

$$K_{vco} = \frac{\Delta f_s}{\Delta V_c}$$

where $\Delta_s$ designates the variation of the frequency of the slaved oscillator 1 when the control voltage varies by a given step $\Delta V_c$. The phase noise on the contrary varies proportionally to the same time constant and in inverse ratio to the above defined factor $K_{vco}$.

The reduction of the phase noise of such a loop can then only be obtained at the price of a reduction in the locking speed.

In the diagram of FIG. 2 showing one embodiment of the invention, the elements identical to those in FIG. 1 bear the same references numbers 1 to 6.

The signal from modulator 6 is applied to an integrator 8 whose integration time constant is chosen relatively large. The signal $V_{c1}$ from the integrator is applied by a connection 9 to a first control input $E_{c1}$ of the slaved oscillator 1.

Figure 4:
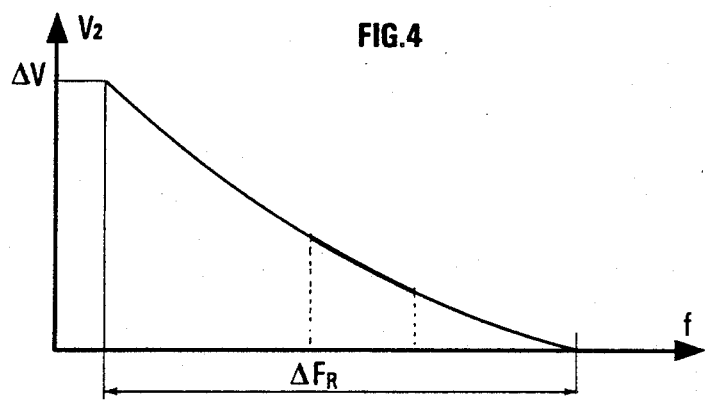
FIG. 4 shows a curve representative of the oscillation frequency deviation for a certain variation of the control voltage applied to a capacitive means through the second loop.
Figure 5:
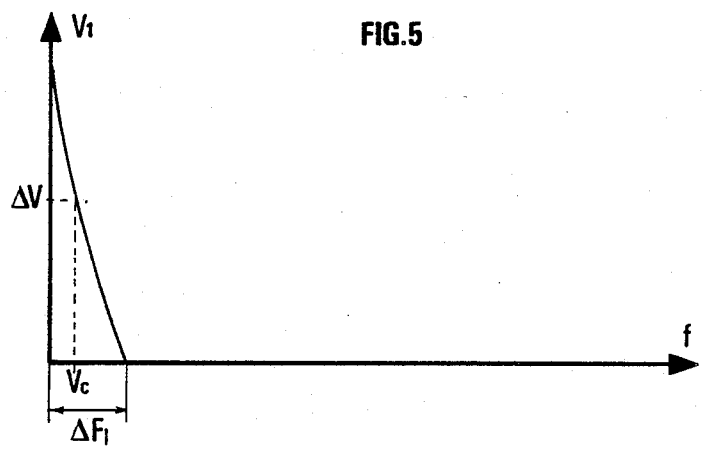
FIG. 5 shows a similar curve for the capacitive means actuated by the first loop.

The latter is of a known type and comprises, for example (FIG. 3), an oscillator circuit 10 connected by a connection capacitor $C_{L1}$ to a first diode of the "varicap" type 11. Through a first input $E_{c1}$ a control voltage $V_{c1}$ can be applied to diode 11, which modifies its own capacity. A second connecting capacitor $C_{L2}$ connects to the oscillator circuit 10 a second diode 12 also of varicap type, which is controlled by applying a second control voltage $V_{c2}$ applied to an input $E_{c2}$. Diodes 11 and 12 and the connecting capacitors $C_{L1}$ and $C_{L2}$ are chosen so that the factor $k_{vco}$ corresponding to the input $E_{c1}$ is much smaller than the factor $K_{vco}$ corresponding to the other input $E_{c2}$. This is translated by the curves of FIGS. 4 and 5 which show that the deviation $\Delta f_R$ of the oscillation frequency caused by the same step $\Delta V$ of the control voltage applied to input $E_{c2}$ is much greater than the corresponding deviation $\Delta F_L$ observed by action of the input $E_{c1}$.

The output of integrator 8 (FIG. 2) is connected through an electronic switch 12 to a second integrator 13 whose integration time constant is much shorter than that of the preceding one 8. The integration output 13 is connected through an inverting amplifier 14 to the second input $E_{c2}$ of the slaved oscillator 1.

Switch 12 is actuated by a comparator of the "window" type 15 to which a stable reference voltage $V_{fm}$ is applied. Element 15 compares the output voltage of integrator 8 with this reference voltage. As long as its value is situated outside a voltage range or window of given but adjustable width $d_f$ centered on the reference voltage $V_{fm}$, comparator 15 keeps switch 12 closed. As soon as its value exceeds the high or low threshold on each side of $V_{fm}$, it causes the switch 12 to open, which results in stabilizing the voltage at the output of integrator 13. The latter acts as a storage means. An element 16 connected to connection 9 applies an external modulation voltage $E_m$ so as to modulate the frequency of signal $V_s$ coming from the slaved oscillator 1, without this modulation disturbing the locking because of the relatively high time constant of the integrator 8 and because of the hysteresis effect proper to the window comparator of the "high speed" loop which makes possible an adjustable deviation $d_f$ of the phase and of the frequency of the signal $f_s$.

A reference voltage $V_{fm}$ is chosen close to the value of the control voltage which ensures stabilization of the slaved oscillator which makes it possible for the slow loop to always operate in a very linear range of the capacity/voltage characteristic of the varicap diode 11 (input $E_{c1}$). To obtain a certain modulation of the synthesized signal, it is no longer necessary to adapt the amplitude of the modulating signal produced by element 16 to the frequency thereof. The provision in practice of a possible modulation is then facilitated thereby. Because of the connection of the second loop to the input $E_{c2}$ of the oscillator whose factor $K_{vco}$ is the highest and because of the gain applied by amplifier 14, the control voltage of the slaved oscillator 1 evolves very quickly until it is close to the optimum voltage for locking, which brings the voltage from the integrator back inside the "window" of the comparator 15. On opening switch 12, which is then triggered off by the comparator 15, the voltage applied to input $E_{c2}$ is stabilized and the high speed loop ceases to act. The adjustment of the frequency obtained by a small variation of the control voltage until it is close to the optimum value for locking, is provided by the slowest loop. The phase noise proper to the high speed loop is only added during the brief time interval of setting of the frequency or of the phase. During the whole of the setting time, only the noise proper to the slow loop remains.

Thus, a high locking speed and low permanent phase noise are obtained.

To modify the characteristics of the device of the invention, several parameters may be adjusted, for example:

$$\text{the ratio } \frac{K_{vco}}{k_{vco}}$$

$$\text{the ratio } \frac{d_f}{\Delta VCOL}$$

where $\Delta VCOL$ is the voltage variation range of the slowest loop and $d_f$, it will be recalled, is the width of the "window" of the comparator 15, or else:

the ratio of the respective integration constants of the integrators 8 and 13.

The components for limiting the leak currents of the storage capacitor used in integrator 13 are chosen so that the stored voltage remains stable during the opening time intervals of switch 12, so as to limit as much as possible any new action of the high speed loop after setting of the slaved oscillator 1.

The device of the invention may be used more particularly for driving FM transceivers such as those providing communication between a central control and recording laboratory and different acquisition boxes of a seismic data transmission system, for example.

Compared with the single loop servo circuits of the prior art, it makes it possible to widen the pass band in the low part of the modulation spectrum, to define with greater precision the operating point of the element which applies the frequency modulation to the slaved oscillator and it increases the locking speed, whatever the width of the frequency band in which it is operating.

The device of the invention may be also used in a digital transmission system for example for reforming a signal having the same frequency and the same phase as a digital signal transmitted over lines and more particularly a clock signal.

What is claimed:

1. A device for rapidly and with low nose locking the frequency of a signal to that of an imposed signal from a reference oscillator comprising a slaved oscillator whose oscillation frequency can be varied by application of a control voltage and a first feed-back loop for bringing the control voltage back to an optimum value for stabilizing the frequency of the slaved oscillator, the phase noise inherent in said first loop and its response speed being relatively low, further comprising, in parallel with the first feed-back loop, which is permanently closed, a second feed-back loop causing a much faster variation of the oscillation frequency of the slaved oscillator than that caused by the first loop and control means for closing said second loop intermittently as long as the voltage difference between the control voltage applied to the slaved oscillator and said optimum value is greater than a given threshold value, said second loop including voltage storage means.

2. The device as claimed in claim 1 further comprising a means for applying a modulation signal whose amplitude is chosen less than said voltage difference.

3. The device as claimed in claim 1 wherein said control means for closing said second loop intermittently comprise switching means controlled by a voltage comparator which is adapted for comparing the control voltage with a reference value.

4. The device as claimed in claim 3, wherein said slaved frequency oscillator is chosen so that the ratio between the variation of its oscillation frequency caused by the same variation of the control voltage applied is much greater when this voltage is applied by the second feed-back loop than when it is applied by the first.

5. The device as claimed in claim 1, comprising a modulator for mixing a signal whose frequency depends on that of the signal from the slaved oscillator and another signal whose frequency depends on that of the signal from the reference oscillator and filtering means for taking off the low frequency component of the signal from said modulator, wherein said slaved oscillator comprises an oscillator circuit associated with a control assembly for varying its oscillation frequency, which assembly comprises a first capacitive means causing a relatively low frequency shift for a certain variation of the control voltage and a second capacitive means causing a greater frequency shift than the first one, for the same variation of the frequency voltage and said first loop and said second loop are connected respectively to said first capacitive means and to said second capacitive means.

6. The device as claimed in claim 5, wherein said first loop comprises connection means for connecting the filtering means to said first capacitive means and the storage means of said second loop are provided with an input connected to said filtering means through switching means and an output connected to said second capacitive means.

7. The device as claimed in claim 6, wherein said storage means comprise an integrator with low time constant.

* * * * *